(12) United States Patent
Chou

(10) Patent No.: US 12,051,739 B2
(45) Date of Patent: Jul. 30, 2024

(54) PACKAGE STRUCTURE HAVING A FIRST CONNECTION CIRCUIT AND MANUFACTURING METHOD THEREOF

(71) Applicant: INNOSCIENCE (ZHUHAI) TECHNOLOGY CO., LTD., Zhuhai (CN)

(72) Inventor: Yi-Lun Chou, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 919 days.

(21) Appl. No.: 16/981,299

(22) PCT Filed: Jul. 2, 2020

(86) PCT No.: PCT/CN2020/099871
§ 371 (c)(1),
(2) Date: Sep. 16, 2020

(87) PCT Pub. No.: WO2022/000403
PCT Pub. Date: Jan. 6, 2022

(65) Prior Publication Data
US 2022/0005944 A1    Jan. 6, 2022

(51) Int. Cl.
*H01L 29/778* (2006.01)
*H01L 29/20* (2006.01)
*H01L 29/66* (2006.01)

(52) U.S. Cl.
CPC ...... *H01L 29/7786* (2013.01); *H01L 29/2003* (2013.01); *H01L 29/66462* (2013.01)

(58) Field of Classification Search
CPC ............ H01L 29/66462; H01L 29/778; H01L 29/7786; H01L 29/7787
See application file for complete search history.

(56) References Cited

U.S. PATENT DOCUMENTS

2008/0087915 A1* 4/2008 Uemoto ............ H01L 29/1066
257/E29.252
2011/0037101 A1* 2/2011 Nakazawa ............ H01L 29/207
257/E29.091
(Continued)

FOREIGN PATENT DOCUMENTS

CN         103022119 A     4/2013
CN         103022121 A     4/2013
(Continued)

OTHER PUBLICATIONS

International Search Report and Written Opinion of the corresponding PCT application No. PCT/CN2020/099871 dated Mar. 25, 2021.

*Primary Examiner* — Robert G Bachner
*Assistant Examiner* — Molly K Reida
(74) *Attorney, Agent, or Firm* — JCIPRNET

(57) ABSTRACT

A semiconductor device structure includes a substrate, a channel layer, a barrier layer and a doped group III-V layer. The channel layer is disposed on the substrate. The barrier layer is disposed on the channel layer. The doped group III-V layer is disposed on the barrier layer. The doped group III-V layer includes a first portion and a second portion. The first portion has a first concentration of a first element. The second portion is adjacent to the first portion and has a second concentration of the first element. The gate structure is disposed on the first portion of the doped group III-V layer. The first concentration of the first element is different from the second concentration of the first element.

28 Claims, 16 Drawing Sheets

(56) References Cited

U.S. PATENT DOCUMENTS

2015/0270379 A1 9/2015 Kuraguchi et al.
2019/0296139 A1* 9/2019 Wei .................... H01L 29/2003

FOREIGN PATENT DOCUMENTS

CN 103077890 A 5/2013
CN 106783962 A 5/2017

* cited by examiner

PACKAGE STRUCTURE HAVING A FIRST CONNECTION CIRCUIT AND MANUFACTURING METHOD THEREOF

BACKGROUND

1. Field of the Disclosure

The present disclosure relates to a semiconductor device structure and more particularly to a semiconductor device structure with a doped group III-V layer.

2. Description of Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a channel layer, a barrier layer, a doped group III-V layer and a gate structure. The channel layer is disposed on the substrate. The barrier layer is disposed on the channel layer. The doped group III-V layer is disposed on the barrier layer. The doped group III-V layer includes a first portion and a second portion. The first portion has a first concentration of a first element. The second portion is adjacent to the first portion and has a second concentration of the first element. The gate structure is disposed on the first portion of the doped group III-V layer. The first concentration of the first element is different from the second concentration of the first element.

According to some embodiments of the present disclosure, a semiconductor device structure includes a substrate, a channel layer, a barrier layer, a first semiconductor layer, a second semiconductor layer and a gate structure. The channel layer is disposed on the substrate. the barrier layer is disposed on the channel layer. The first semiconductor layer is disposed on the barrier layer. The second semiconductor layer is disposed on the barrier layer and in direct contact with the first semiconductor layer. An upper surface of the first semiconductor layer is elevationally different from an upper surface of the second semiconductor layer. The gate structure is disposed on the first semiconductor layer.

According to some embodiments of the present disclosure, a method of manufacturing a semiconductor device structure includes: providing a substrate; forming a channel layer on the substrate; forming a barrier layer on the channel layer; forming a doped group III-V layer on the barrier layer; and treating a portion of the doped group III-V layer, such that a first concentration of a first element in the portion being different from a second concentration of the first element in remaining portion of the doped group III-V layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
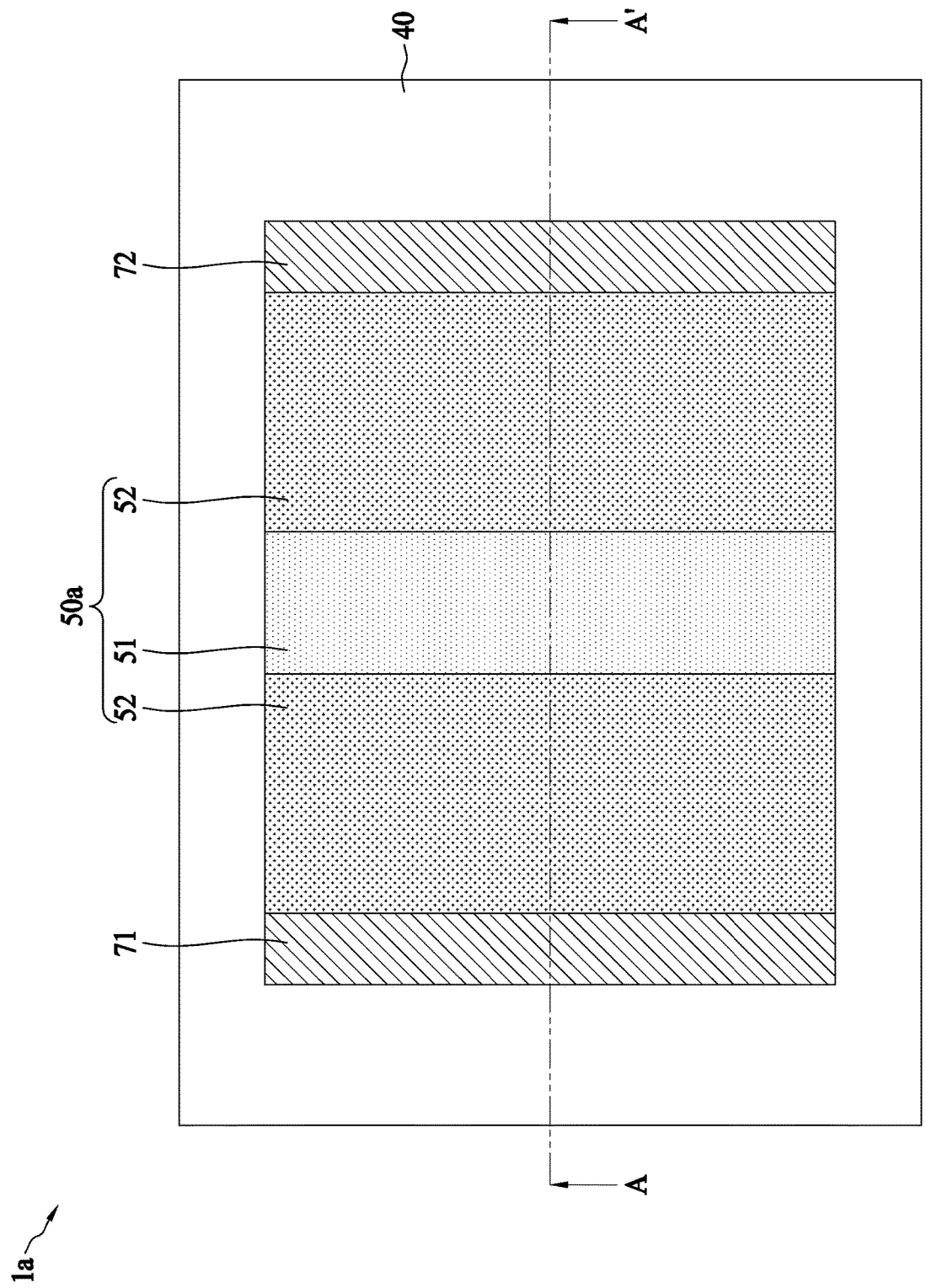
FIG. 1 is a top view of a semiconductor device structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor device structure with a doped group III-V layer. The doped group III-V layer may include two or more portions with different concentration of dopant(s), thereby controlling the sheet resistance of the doped group III-V layer.

FIG. 1 is a top view of a semiconductor device structure 1*a* in accordance with some embodiments of the present disclosure. Some elements are omitted for brevity. The semiconductor device structure 1*a* may include a doped group III-V layer 50*a* extending from a source 71 to a drain 72. The doped group III-V layer 50*a* may include a portion 51 and a portion 52. The portion 52 may be adjacent to the portion 51. The portion 52 may be disposed between the portion 51 and the source 71. The portion 52 may be disposed between the portion 51 and the drain 72. The portion 52 may have two separated segments located on two opposite sides of the portion 51. The portion 52 may surround the portion 51. The portion 52 may enclose the portion 51.

Figure 2:
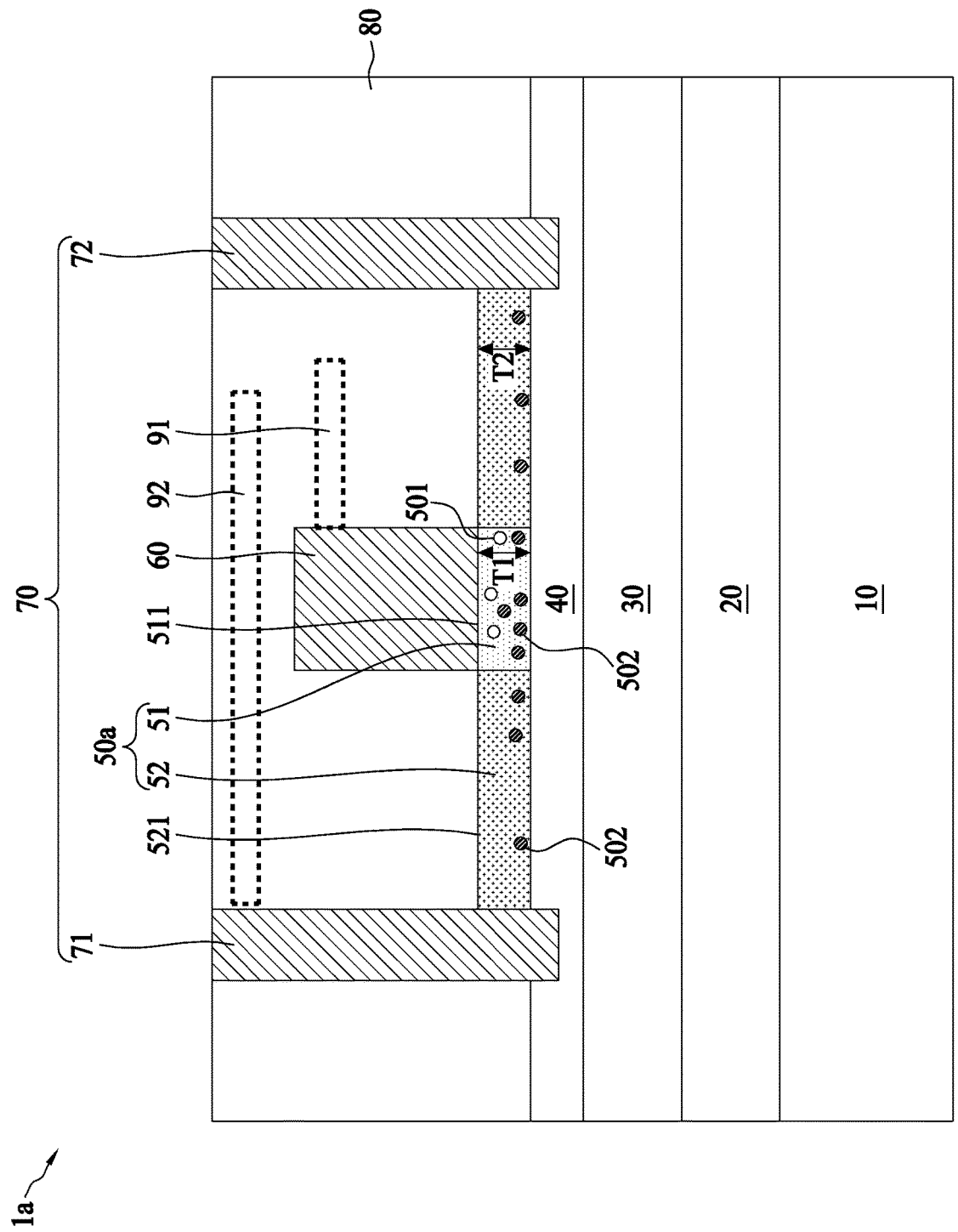
FIG. 2 is a cross-sectional view of a semiconductor device structure in accordance with some embodiments of the present disclosure.

FIG. 2 is a cross-sectional view of a semiconductor device structure 1*a* across a line A-A' depicted in FIG. 1 in accordance with some embodiments of the present disclosure.

As shown in FIG. 2, the semiconductor device structure 1*a* may include a substrate 10, a channel layer 30, a barrier layer 40, a doped group III-V layer 50*a*, a gate structure 60, a source 71 and a drain 72.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials.

The channel layer 30 is disposed on the substrate 10. The channel layer 30 may include a group III-V layer. The channel layer 30 may include, but is not limited to, a group III nitride, for example, a compound $In_xAl_yGa_{1-x-y}N$, in which $x+y \le 1$. The group III nitride further includes, but is not limited to, for example, a compound $Al_yGa_{(1-y)}N$, in which $y \le 1$. The channel layer 30 includes a gallium nitride (GaN) layer. GaN has a band gap of about 3.4 V. The thickness of the channel layer 30 ranges, but is not limited to, from about 0.5 μm to about 10 μm. The channel layer 30 can include indium.

The barrier layer 40 is disposed on the channel layer 30. The barrier layer 40 may include a group III-V layer. The barrier layer 40 may include, but is not limited to, a group III nitride, for example, a compound $In_xAl_yGa_{1-x-y}N$, in which $x+y \le 1$. The group III nitride further includes, but is not limited to, for example, a compound $Al_yGa_{(1-y)}N$, in which $y \le 1$. The barrier layer 40 has a greater bandgap than that of the channel layer 30. The barrier layer 40 can include an aluminum gallium nitride (AlGaN) layer. The barrier layer 40 can include indium. AlGaN has a band gap of about 4.0 V. The thickness of the barrier layer 40 ranges, but is not limited to, from about 10 nm to about 100 nm.

A heterojunction is formed between the barrier layer 40 and the channel layer 30. Polarization of the heterojunction can form a two-dimensional electron gas (2DEG) in the channel layer 30 adjacent to the interface between the barrier layer 40 and the channel layer 30. The 2DEG is formed in a layer with a relatively small bandgap, such as the channel layer 30 which includes GaN.

The gate structure 60 is disposed on the barrier layer 40. The gate structure 60 may include, but is not limited to, a gate metal. The gate metal may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The semiconductor device structure 1*a* may include an enhancement-mode device, which is preset to be in an OFF state when the gate structure 60 is in a zero bias state. Applying a voltage across the gate structure 60 induces electrons or charges in a region below the gate structure 60, which may be referred to as an electron or charge inversion layer. As the voltage increases, the number of electrons or charges that are induced increases. The minimum voltage that is applied to form the inversion layer is called the threshold voltage, expressed as Vth.

In this embodiment, the semiconductor device structure 1*a* may include a doped group III-V layer 50*a*. The doped group III-V layer 50*a* is disposed on the barrier layer 40. The doped group III-V layer 50*a* may be in contact with the barrier layer 40.

The doped group III-V layer 50*a* can include a portion 51 and a portion 52. The portion 51 may be disposed in a relatively central region of the doped group III-V layer 50*a*. The portion 52 may be disposed in a relatively peripheral region of the doped group III-V layer 50*a*. The portion 52 may surround the portion 51. The portion 52 may be in contact with the portion 51.

The gate structure 60 is disposed on the portion 51. The gate structure 60 is disposed directly on the portion 51. The gate structure 60 is in contact with the portion 51. The gate structure 60 may cover the portion 51. The portion 52 is not covered by the gate structure 60. A portion of the portion 52 is not covered by the gate structure 60. A part of the portion 51 may be exposed from the gate structure 60.

The doped group III-V layer 50*a* may include a III-V group layer doped with p-type dopant(s) 501. The doped group III-V layer 50*a* may include p-doped GaN or other suitable III-V group layer. The portion 51 may include a p-doped GaN or other suitable III-V group layer. The portion 52 may include a p-doped GaN or other suitable III-V group layer. The p-type dopant(s) 501 may include, for example but is not limited to, at least one of magnesium (Mg), beryllium (Be), zinc (Zn) and cadmium (Cd).

In addition to p-type dopant(s) 501, the portion 51 may further include other dopant(s) 502, for example but is not limited to, cobalt, titanium, nickel, platinum, oxygen, nitrogen, or a combination thereof. In addition to p-type dopant(s) 501, the portion 52 may further include other dopant(s) 502, for example but is not limited to, cobalt, titanium, nickel, platinum, oxygen, nitrogen or a combination thereof. Such additional or extra dopant(s) 502 may be used to, for example but is not limited to, facilitate activation of the portion 51 (during manufacture) to deplete 2DEG under the portion 51. For example, the portion 51 may include Mg—H bonding before activation, and the additional or extra dopant(s) 502 may assist in breaking Mg—H bond to release holes or protons (e.g. atomic particle(s) having positive electrical charge), which may enhance or increase the concentration of holes.

The concentration of additional dopant(s) 502 in the portion 51 may be different from that in the portion 52. For example, if one of titanium (Ti), nickel, platinum, cobalt, oxygen or nitrogen is selected as the additional dopant(s) 502, the concentration thereof in the portion 51 can be greater than that in the portion 52.

The concentration of additional dopant(s) 502 in the portion 52 is relatively less, which may not result in enough holes to deplete electrons of 2DEG under the portion 52. The concentration of additional dopant(s) 502 in portion 51 is relatively great to provide relatively great number of holes to deplete electrons of 2DEG under the portion 51. The concentration of the hydrogen in the portion 51 may be different from the concentration of the hydrogen in the portion 52.

The portion 51 may have a surface 511. The portion 52 may have a surface 521. The surface 511 may also be referred to as an upper surface. The surface 521 may also be referred to as an upper surface.

The surface 511 of the portion 51 may substantially coplanar with the surface 521 of the portion 52. The surface 521 of the portion 52 has an elevation the same as the surface 511 of the portion 51. The portion 51 may have a thickness T1. The portion 52 may have a thickness T2. The thickness T1 may range from about 10 nm to about 100 nm. The thickness T1 may range from about 100 nm to about 1000 nm. The thickness T2 may range from about 10 nm to about 100 nm. The thickness T2 may range from about 100 nm to about 1000 nm. The thickness T1 can be substantially same to the thickness T2.

As discussed above, the additional dopant(s) 502 may help to break the Mg—H bond to release holes or protons (e.g. atomic particle(s) having positive electrical charge) during manufacture. Therefore, the number of the holes in the portion 51 can be affected by the concentration of additional dopant(s) 502. The number of the holes in the portion 52 can affected by the concentration of additional dopant(s) 502. Relatively great number of holes may result in a relatively less sheet resistance. For example, if the concentration of additional dopant(s) 502 in the portion 52 is less than the portion 51 (which means there are relatively less holes in the portion 52), the sheet resistance of the portion 52 can be greater than that of the portion 51. In such scenario, the portion 51 may also be referred to as a relatively low resistance layer. The portion 52 may also be referred to as a relatively high resistance layer.

The semiconductor device structure 1a further includes a buffer layer 20. The buffer layer 20 is disposed between the substrate 10 and the channel layer 30. The buffer layer 20 may be configured to reduce defect due to the dislocation between the substrate 10 and the subsequently formed III-V compound layer. The buffer layer 20 may include, but is not limited to, nitride, such as AlN, AlGaN or the like.

The semiconductor device structure 1a further includes a source/drain structure 70. The source/drain structure 70 includes a source 71 and a drain 72. The source 71 and the drain 72 may be disposed between two opposite sides of the gate structure 60. Although the source 71 and drain 72 are respectively disposed on two opposite sides of the gate structure 60 in FIG. 2, the source 71, the drain 72, and the gate structure 60 may have different configurations in other embodiments of the present disclosure due to the design requirements.

The source 71 and drain 72 may include, for example, without limitation, a conductive material. The conductive materials may include, but is not limited to, for example, metals, alloys, doped semiconductor materials (e.g., doped crystalline silicon), or other suitable conductor materials.

A portion of the source 71 may be located in the channel layer 30. A portion of the drain 72 may be located in the channel layer 30. In some other embodiments, the source 71 may be disposed on the channel layer 30. In some other embodiments, the drain 72 may be disposed on the channel layer 30. The source 71 may run through the passivation layer 80 and the barrier layer 40 to contact the channel layer 30. The drain 72 may run through the passivation layer 80 and the barrier layer 40 to contact the channel layer 30. The source 71 may end at the barrier layer 40. The source 71 may not be in contact with the channel layer 30. The drain 72 may end at the barrier layer 40. The drain 72 may not be in contact with the channel layer 30.

The portion 52 may be in contact with the source 71. The portion 52 may be in contact with the drain 72. The portion 52 may extend from the portion 51 toward the source 71. The portion 52 may extend from the portion 51 toward the drain 72.

The semiconductor device structure 1a further includes a passivation layer 80. The passivation layer 80 may cover the doped group III-V layer 50a. The passivation layer 80 may cover the gate structure 60. The passivation layer 80 may be in contact with the portion 52. The passivation layer 80 may be separated from the portion 51. The passivation layer 80 may not be in contact with the portion 51. The passivation layer 80 may include, but is not limited to, oxide or nitride, such as SiN, SiO$_2$ and the like. The passivation layer 80 may include, but is not limited to, a composite layer of an oxide and a nitride, such as Al$_2$O$_3$/SiN, Al$_2$O$_3$/SiO$_2$, AlN/SiN, AlN/SiO$_2$, and the like.

The semiconductor device structure 1a may include a field plate 91. The field plate 91 may extend from the gate structure 60 toward the drain 72. The semiconductor device structure 1a may include a field plate 92. The field plate 92 may extend from the source 71 toward the drain 72. The field plate 92 may cover at least a portion of the gate structure 60. The field plate 91 and/or field plate 92 may include, but is not limited to, conductive materials. The conductive materials may include, but is not limited to, for example, metals, alloys, doped semiconductor materials (e.g., doped crystalline silicon), or other suitable conductive materials. The field plate 91 and/or field plate 92 can be at zero potential.

The portion 52 may assist in forming a more uniform electric field between the gate structure 60 and the drain 72, enhancing the threshold voltage of the semiconductor device structure 1a. Therefore, the field plate 91 and/or the field plate 92 can be omitted due to the formation of portion 52 in accordance with some embodiments of the disclosure, reducing the cost and simplifying the process.

Figure 3:
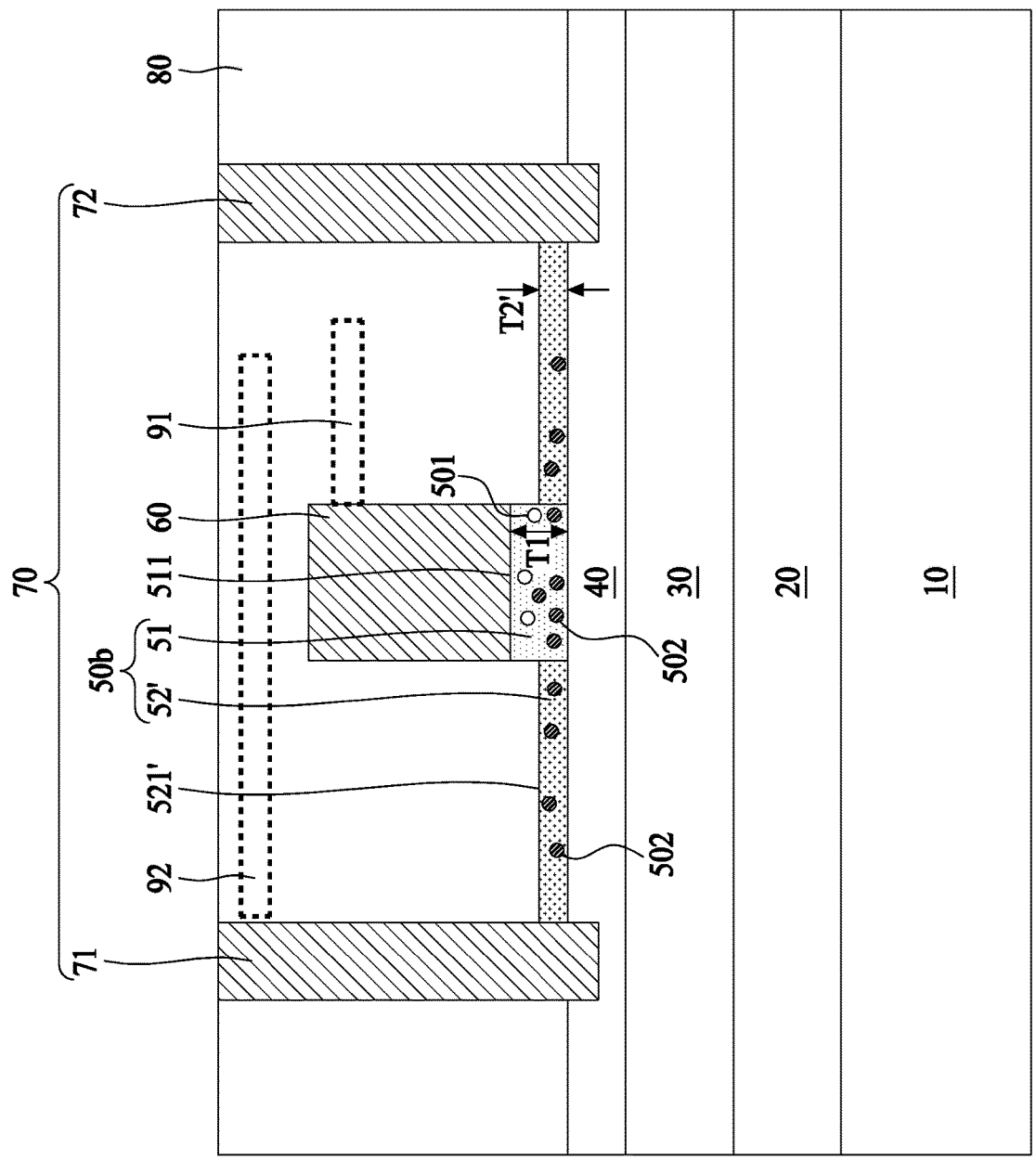
FIG. 3 is a cross-sectional view of a semiconductor device structure in accordance with some embodiments of the present disclosure.

FIG. 3 is a cross-sectional view of a semiconductor device structure 1b in accordance with some embodiments of the present disclosure.

The semiconductor device structure 1b is similar or the same to the semiconductor device structure 1a as illustrated and described with reference to FIG. 2, except that the doped group III-V layer 50a is replaced by the doped group III-V layer 50b.

The doped group III-V layer 50b has a portion 52' having a relatively less thickness. The surface 521' of the portion 52' is elevationally different from the surface 511 of the portion 51.

The thickness T2' of the portion 52' is different from the thickness T1 of the portion 51. The thickness T2' of the portion 52' can be varied of interest. The thickness T2' may range from about 1 nm to about 5 nm. The thickness T2' may range from about 5 nm to about 10 nm. The surface 521' of the portion 52' may be not coplanar with the surface 511 of the portion 51. The surface 521' of the portion 52' may have an elevation less than surface 511 of the portion 51. The surface 521' of the portion 52' can be lower than surface 511 of the portion 51. The roughness of the surface 511 can be different from that of the surface 521'.

In some other some embodiments, the thickness of the portion 52' can have various thicknesses in different locations or regions. For example, the portion 52' may have a relatively great thickness adjacent to the portion 51 and a relatively less thickness adjacent to the source 71 or the drain 72. Alternatively, the portion 52' may have a relatively less thickness adjacent to the portion 51 and a relatively great thickness adjacent to the source 71 or the drain 72. The portion 52' can have a variable thickness in some other embodiments. In other words, the portion 52' does not have a constant thickness in some other embodiments.

The portion 51 may be in contact with the passivation layer 80. A side surface of the portion 51 may be in contact with the passivation layer 80.

As the thickness T2' changes, on resistance (Rds-on) of the semiconductor device structure 1b changes. That is, Rds-on may be controlled by the thickness T2' of the portion 52', improving performance of the semiconductor device structure 1b.

Figure 4:
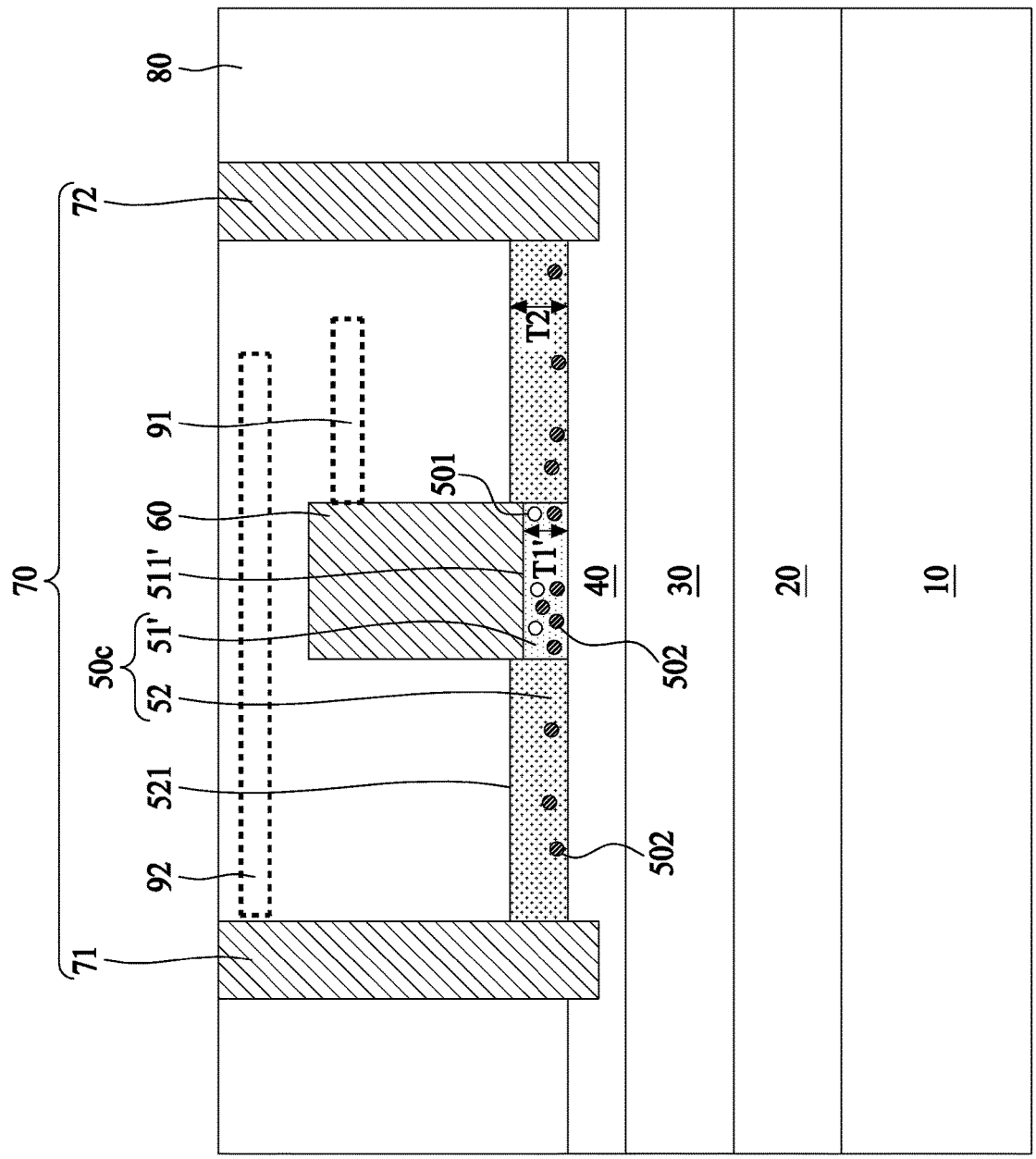
FIG. 4 is a cross-sectional view of a semiconductor device structure in accordance with some embodiments of the present disclosure.

FIG. 4 is a cross-sectional view of a semiconductor device structure 1c in accordance with some embodiments of the present disclosure.

The semiconductor device structure 1c is similar or the same to the semiconductor device structure 1a as illustrated and described with reference to FIG. 2, except that the doped group III-V layer 50a is replaced by the doped group III-V layer 50c.

The doped group III-V layer 50c has the portion 51' having a relatively less thickness. The surface 521 of the portion 52 can be elevationally different from the surface 511' of the portion 51'.

The thickness T1' of the portion 51' can be varied. The thickness T1' of the portion 51' can be different from the thickness T2 of the portion 52. The thickness T1' of the portion 51' can be less than the thickness T2 of the portion 52. The thickness T1' may range from about 50 nm to about 100 nm. The thickness T1' may range from about 100 nm to about 500 nm. The surface 521 of the portion 52 is not coplanar with the surface 511' of the portion 51'. The surface 521 of the portion 52 has an elevation greater than the surface 511' of the portion 51'. The roughness of the surface 511' can be different from that of the surface 521.

The thickness T1' may be changed or controlled to facilitate manufacture of the semiconductor device structure 1c.

Figure 5:
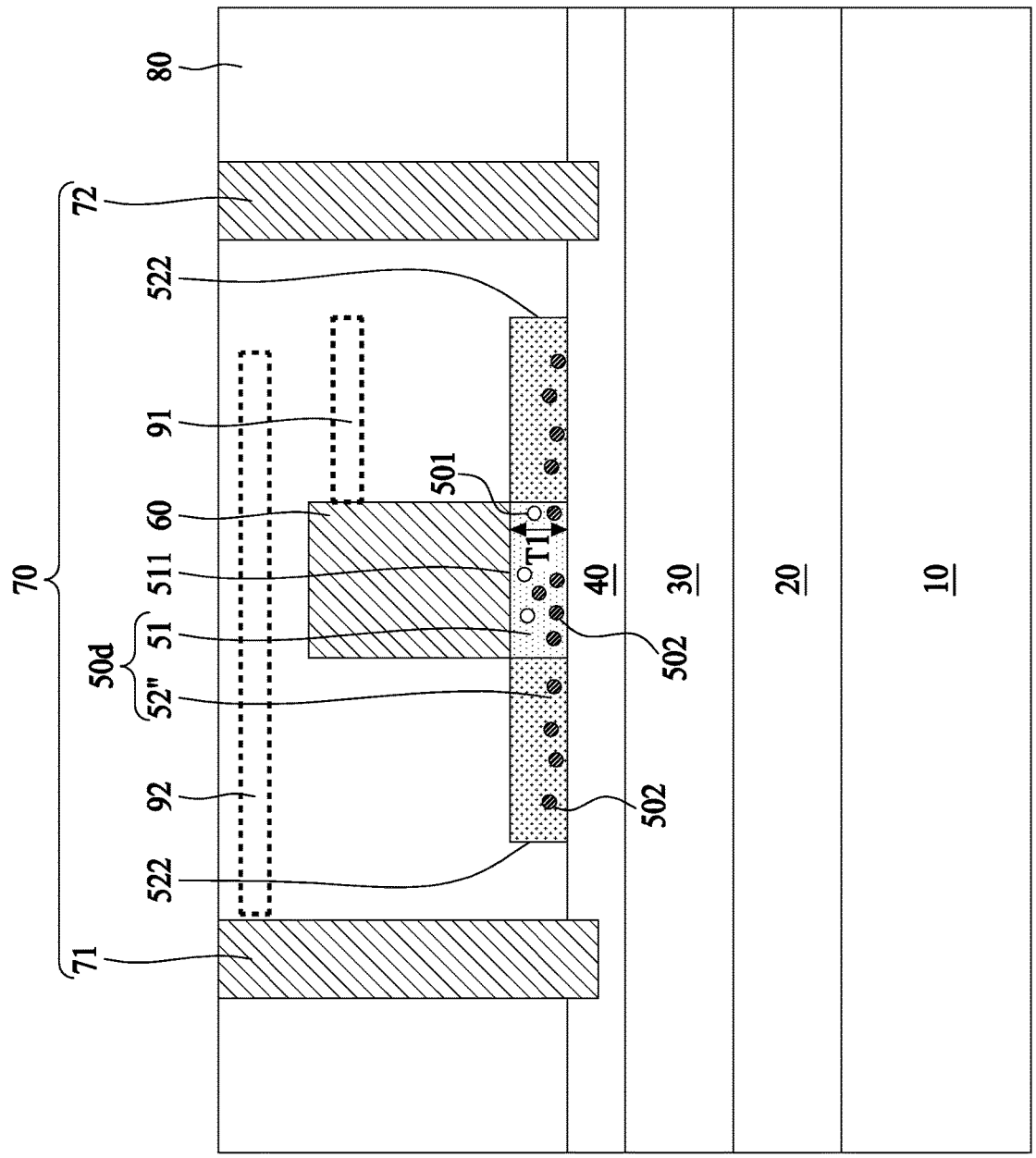
FIG. 5 is a cross-sectional view of a semiconductor device structure in accordance with some embodiments of the present disclosure.

FIG. 5 is a cross-sectional view of a semiconductor device structure 1d in accordance with some embodiments of the present disclosure.

The semiconductor device structure 1d is similar or the same to the semiconductor device structure 1a as illustrated and described with reference to FIG. 2, except that the doped group III-V layer 50a is replaced by the doped group III-V layer 50d.

The portion 52" of the doped group III-V layer 50d may be spaced apart from the source 71. The portion 52" of the doped group III-V layer 50d may be spaced apart from the drain 72. The portion 52" of the doped group III-V layer 50d is not in contact with the source 71. The portion 52" of the doped group III-V layer 50d is not in contact with the drain 72. In some other embodiments, the portion 52" may be in contact with the source 71. In some other embodiments, the portion 52" may not be in contact with the drain 72. In some other embodiments, the portion 52" may be in contact with the drain 72. In some other embodiments, the portion 52" may not be in contact with the source 71.

The surface 522 of the portion 52" may be separated from the source 71. The surface 522 of the portion 52" may be separated from the drain 72. The portion 52" may be separated from the source 71 by the passivation layer 80. The portion 52" may be separated from the drain 72 by the passivation layer 80. The surface 522 of the portion 52" may be in contact with the passivation layer 80. The surface 522 may also be referred to as a side surface of the group III-V layer 50d.

As discussed above, the concentration of additional dopant(s) 502 can affect the sheet resistance. In this embodiment, the concentration of additional dopant(s) 502 in the portion 52" ranges from about $10^{10}$ atoms/cm$^3$ to $10^{19}$ atoms/cm$^3$. It is contemplated that whether the portion 52" is in contact with the source 71 or the drain 72 may depend on additional dopant(s) 502 and concentration of additional dopant(s) 502. For example, when the concentration of additional dopant(s) 502 is greater than a threshold, a short can happen if the portion 52" is in contact with the source 71 or the drain 72, and the portion 52" can be separated from the source 71. Similarly, when the concentration of additional dopant(s) 502 in the portion 52" is greater than a threshold, the portion 52" may be separated from the drain 72. For example, when the concentration of additional dopant(s) 502 in the portion 52" is less than a threshold (for example but is not limited to approximately $10^{17}$ atoms/cm$^3$), the portion 52" may be in contact with the drain 72.

Since the concentration of additional dopant(s) 502 can affect the sheet resistance, the doped group III-V layer 50d may also function as a field plate. Thus, the electric field of the semiconductor device structure may be effected by the doped group III-V layer 50d. It is contemplated that selection of the additional dopant(s) 502 may assist in tuning electric field of the semiconductor device structure 1d. It is contemplated that changes of the concentration of additional dopant(s) 502 may facilitate changes of electric field of the semiconductor device structure 1d. Additionally, size or shape of the doped group III-V layer 50d may also affect the electric field. It is contemplated that adjusting the size or shape of the doped group III-V layer 50d may be varied to assist in tuning electric field of the semiconductor device structure 1d.

Figure 6:
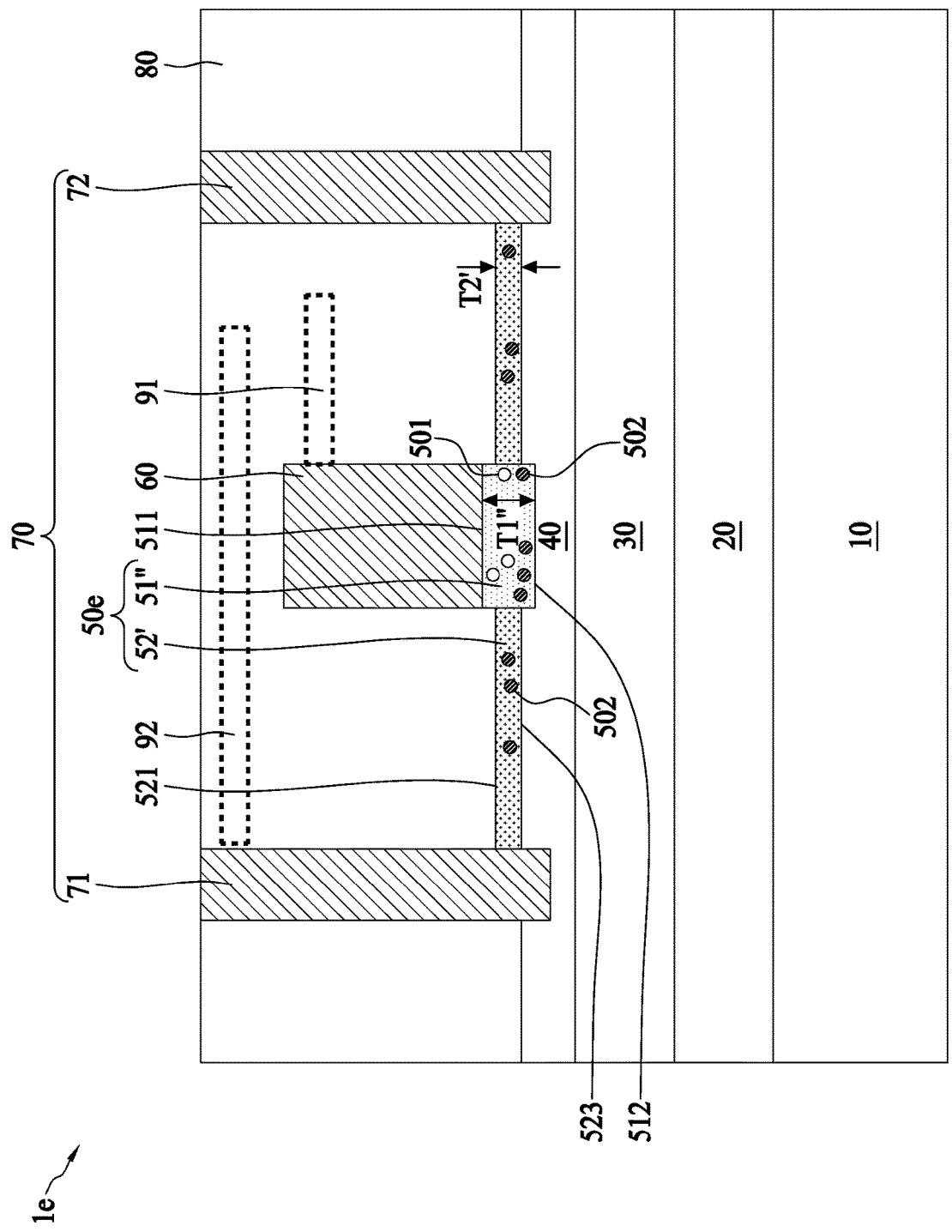
FIG. 6 is a cross-sectional view of a semiconductor device structure in accordance with some embodiments of the present disclosure.

FIG. 6 is a cross-sectional view of a semiconductor device structure 1e in accordance with some embodiments of the present disclosure.

The semiconductor device structure 1e is similar or the same to the semiconductor device structure 1b as illustrated and described with reference to FIG. 3, except that the doped group III-V layer 50a is replaced by the doped group III-V layer 50e.

The portion 51" may have a surface 512 (or a bottom surface 512). The portion 52' may have a surface 523 (or a bottom surface 523). A portion of the portion 51" of the group III-V layer 50e may be embedded in the barrier layer 40. The surface 521 of the portion 52 is elevationally different from the surface 511 of the portion 51". The surface 523 of the portion 52 is elevationally different from the surface 512 of the portion 51".

The surface 511 of the portion 51" is not coplanar with the surface 521 of the portion 52'. The surface 512 of the portion 51" is not coplanar with the surface 523 of the portion 52'. The surface 511 of the portion 51" has an elevation greater than the surface 521 of the portion 52'. The surface 512 of the portion 51" has an elevation less than the surface 523 of the portion 52'. The portion 52' is located between the surface 511 and surface 512 of the portion 51".

FIG. 7A, FIG. 7B, FIG. 7C, FIG. 7D, FIG. 7E and FIG. 7F illustrate various stages of a method for manufacturing a semiconductor device structure in accordance with some embodiments of the present disclosure.

Figure 7A:
FIG. 7A, FIG. 7B, FIG. 7C, FIG. 7D, FIG. 7E and FIG. 7F illustrate various stages of a method for manufacturing a semiconductor device structure in accordance with some embodiments of the present disclosure.

Referring to FIG. 7A, a substrate 10 is provided. A buffer layer 20, a channel layer 30 and a barrier layer 40 are formed on the substrate 10. The buffer layer 20, channel layer 30 and/or barrier layer 40 may be formed by metal organic chemical vapor deposition (MOCVD), metal organic vapor-phase epitaxy (MOVPE), epitaxial growth, or other suitable processes.

Figure 7B:
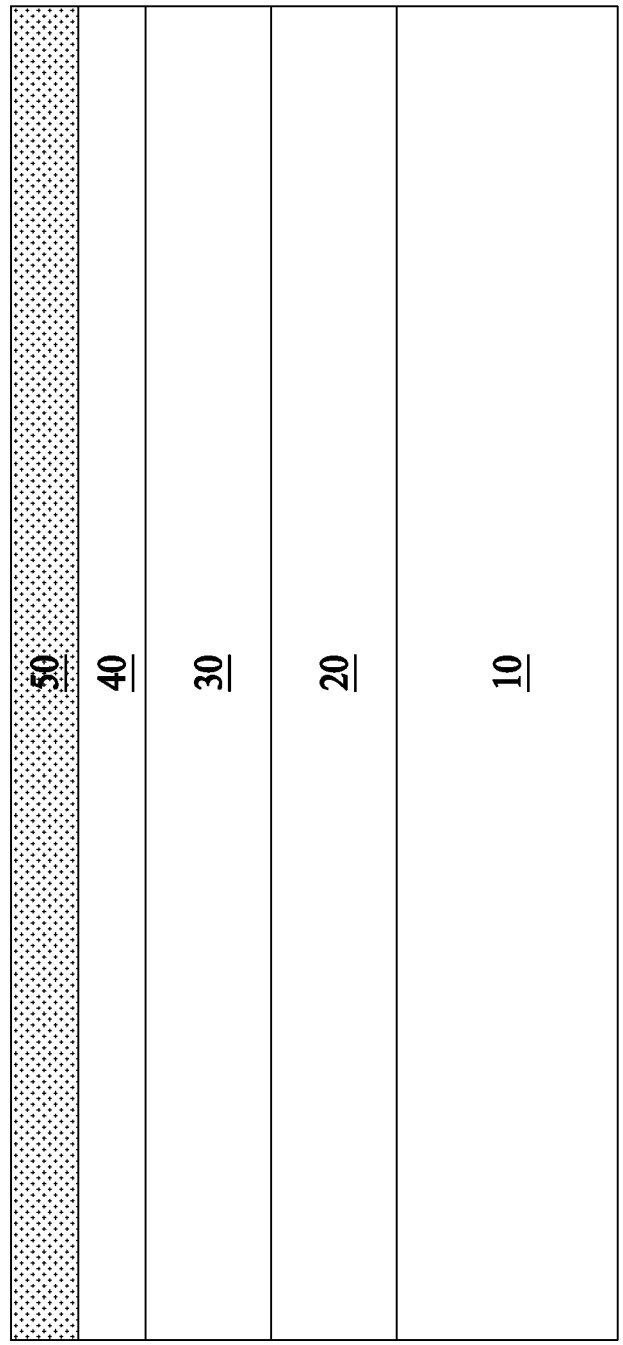

Referring to FIG. 7B, a doped group III-V layer 50 is formed on the barrier layer 40. The doped group III-V layer 50 may be formed by MOCVD, MOVPE, epitaxial growth, or other suitable processes. The doped group III-V layer 50 may be doped with p-type dopant(s) during or after formation of the doped group III-V layer 50.

Figure 7C:
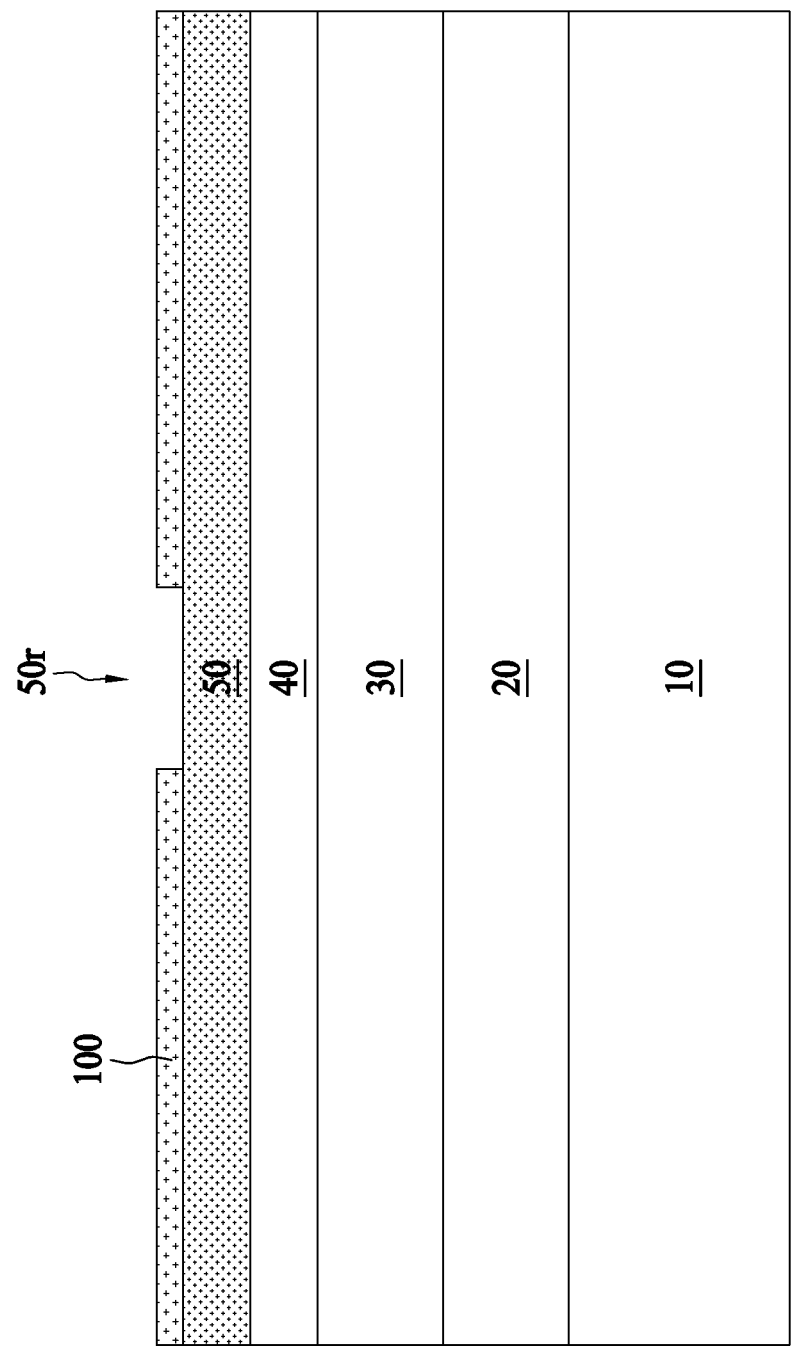

Referring to FIG. 7C, a patterned mask layer 100 is formed on the doped group III-V layer 50. The patterned mask layer 100 may define an opening 50r to expose a portion of the doped group III-V layer 50. The patterned mask layer 100 may include, for example but is not limited to, silicon, gold, titanium nitride, or other suitable material(s) or element(s).

Figure 7D:
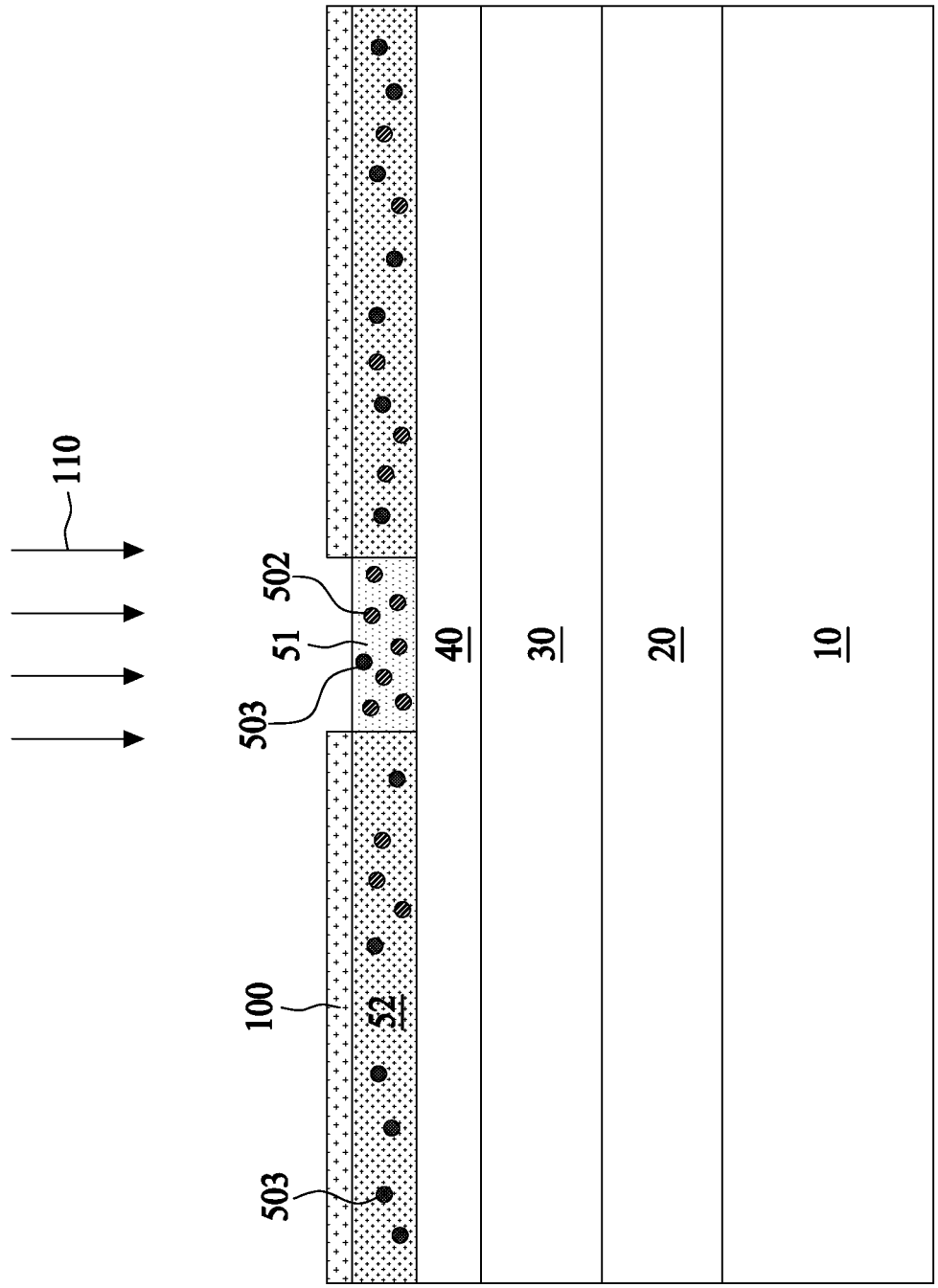

Referring to FIG. 7D, a heat treatment 110 may be performed to the doped group III-V layer 50 as shown in FIG. 7C. A portion of the doped group III-V layer 50 exposed by the patterned mask layer 100 as shown in FIG. 7C is activated to form the portion 51. The portion of the doped group III-V layer 50 covered by the patterned mask layer 100 as shown in FIG. 7C forms the portion 52. The heat treatment 110 can be performed at a temperature ranges from about 700° C. to about 800° C. The heat treatment 110 can be performed in an environment including gas of oxygen, nitrogen or other suitable element(s).

Oxygen may diffuse into the portion, exposed from the opening 50r, of the doped group III-V layer 50, breaking Mg—H bonding to form the portion 51. Therefore, the concentration of additional dopant(s) 502, such as oxygen in the portion 51 may be greater than that of the portion 52. Nitrogen may diffuse into the portion, exposed from the opening 50r, of the doped group III-V layer 50 to form the portion 51. Therefore, the concentration of additional dopant(s) 502, such as nitrogen in the portion 51 may be greater than that of the portion 52.

In this embodiment, the portion 51 has a greater concentration of oxygen or nitrogen than portion 52 has. The elements included in the patterned mask layer 100 may further diffuse into the portion 52. Therefore, the concentration of elements 503, such as, titanium, gold or silicon, in the portion 52 may be different from that of the portion 51. The concentration of elements 503, such as, titanium, gold or silicon, in the portion 52 may be greater than that of the portion 51. The elements included in the patterned mask layer 100 may further diffuse into the barrier layer 40. The barrier layer may include titanium, silicon, gold or a combination thereof.

After performing the heat treatment 110, the concentration of the hydrogen in the portion 51 is different from that in the portion 52 because the concentration of additional dopant(s) 502, such as oxygen or nitrogen, in the portion 51 and that in the portion 52 are different.

Figure 7E:
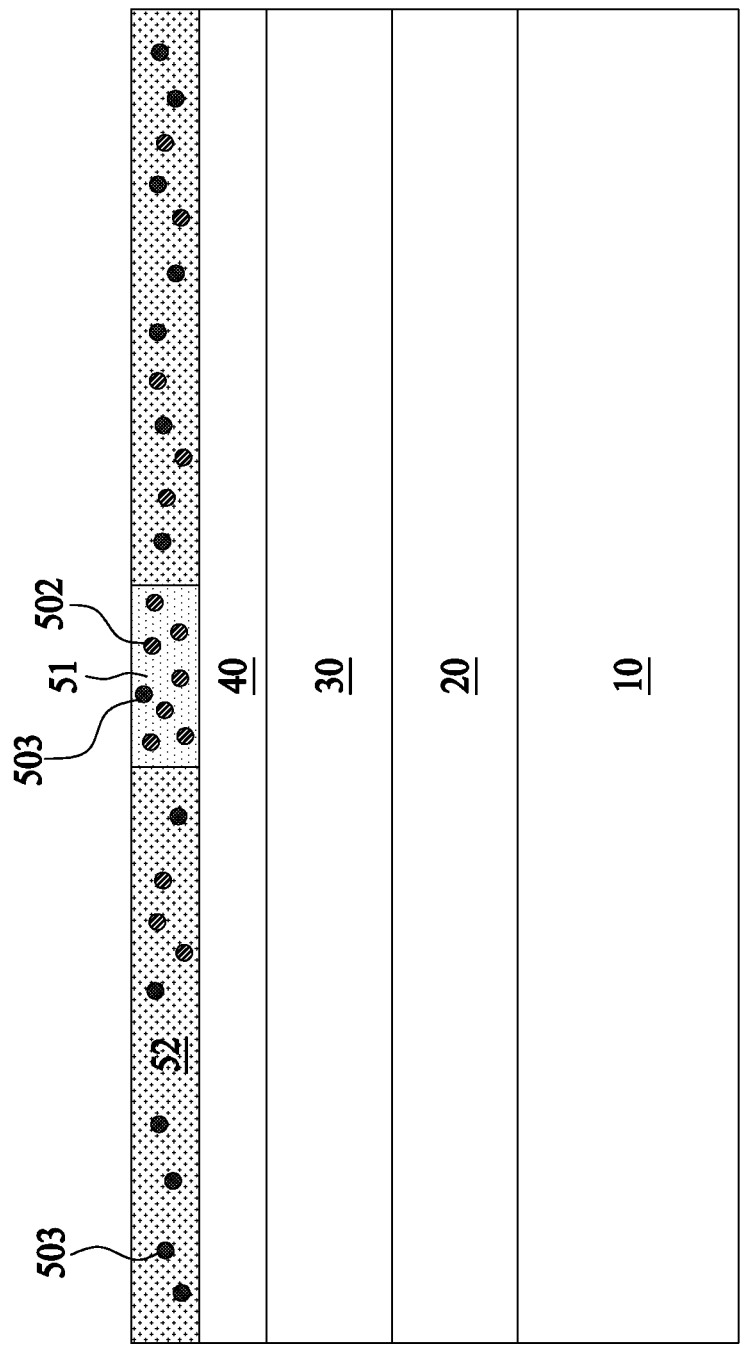

Referring to FIG. 7E, the patterned mask layer 100 can be removed by, for example but is not limited to, etching or other suitable technique. Etching technique may include, for example but is not limited to, dry etching, such as anisotropic etching.

Figure 7F:
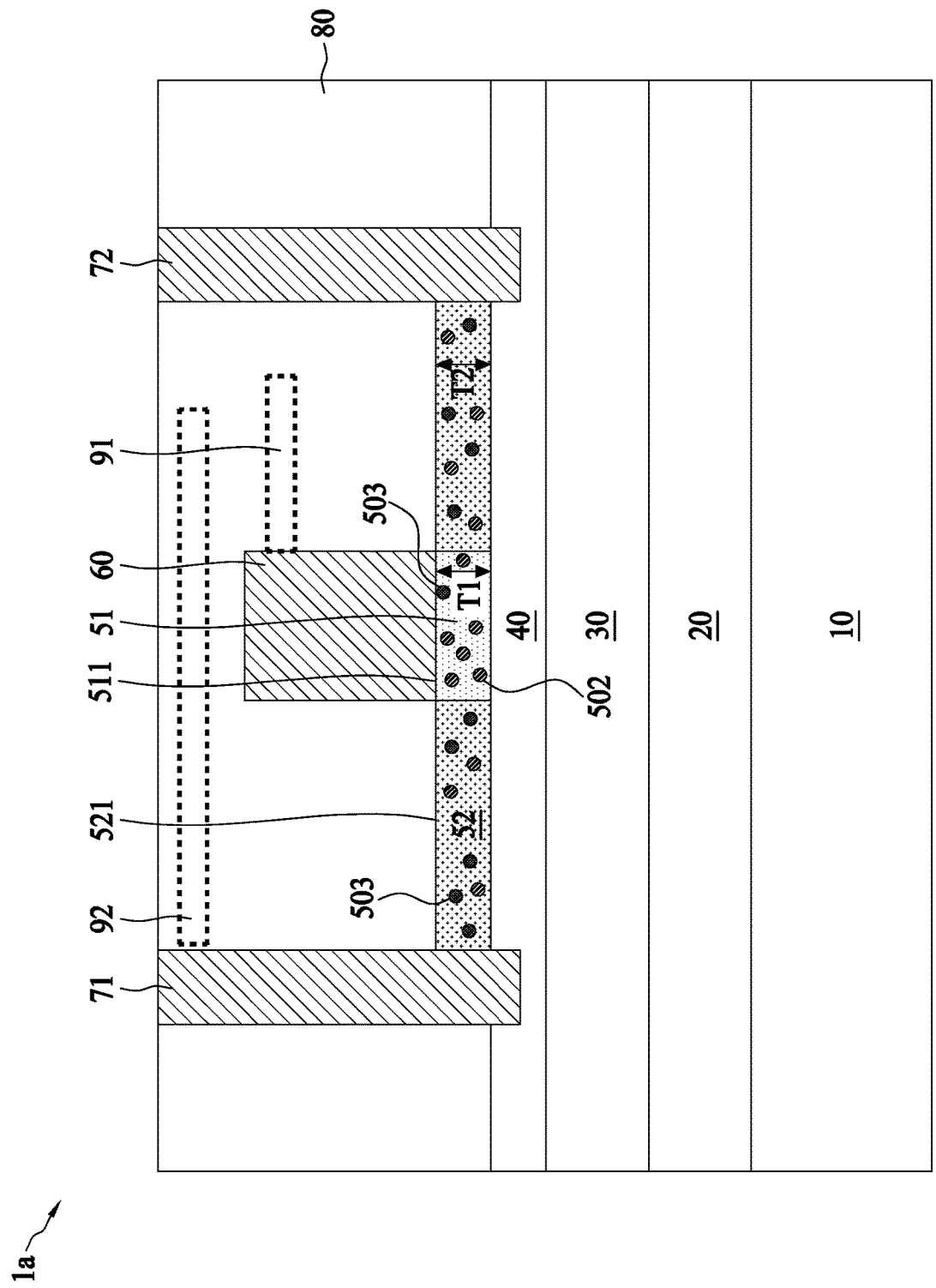

Referring to FIG. 7F, a gate structure 60, a source 71, a drain 72, a passivation layer 80, field plates 91 and 92 are formed to form the semiconductor device structure 1a as illustrated and described with reference to FIG. 2.

The gate structure 60, source 71 and drain 72 may be formed by sputtering, PVD or other suitable processes. The passivation layer 80 may be formed by CVD, PVD or other suitable processes.

It is contemplated that in FIG. 7E, if the portion 52 is over etched (e.g. applying the etching technique on the portion 52 with a relatively great time), a semiconductor device same or similar to the semiconductor device structure 1b as illustrated and described with reference to FIG. 3 can be formed with the following operations as illustrated and described with reference to FIG. 7F. In this embodiment, the portion 52 may serves as a protection layer to prevent from over etching of the barrier layer 40.

It is contemplated that in FIG. 7E, if the portion 52 is patterned (e.g. applying the etching technique on the portion 52 with a patterned mask layer to remove the undesired part of the portion 52), a semiconductor device same or similar to the semiconductor device structure 1d as illustrated and described with reference to FIG. 5 can be formed with the following operations as illustrated and described with reference to FIG. 7F.

It is contemplated that if a recess is formed in the barrier layer 40 in FIG. 7A, and the portion 52 is over etched (e.g. applying the etching technique on the portion 52 with a relatively great time) in FIG. 7E, a semiconductor device same or similar to the semiconductor device structure 1e as illustrated and described with reference to FIG. 6 can be formed with the following operations as illustrated and described with reference to FIG. 7F FIG. 8A, FIG. 8B, FIG. 8C and FIG. 8D illustrate various stages of a method for manufacturing a semiconductor device structure in accordance with some embodiments of the present disclosure.

Figure 8A:
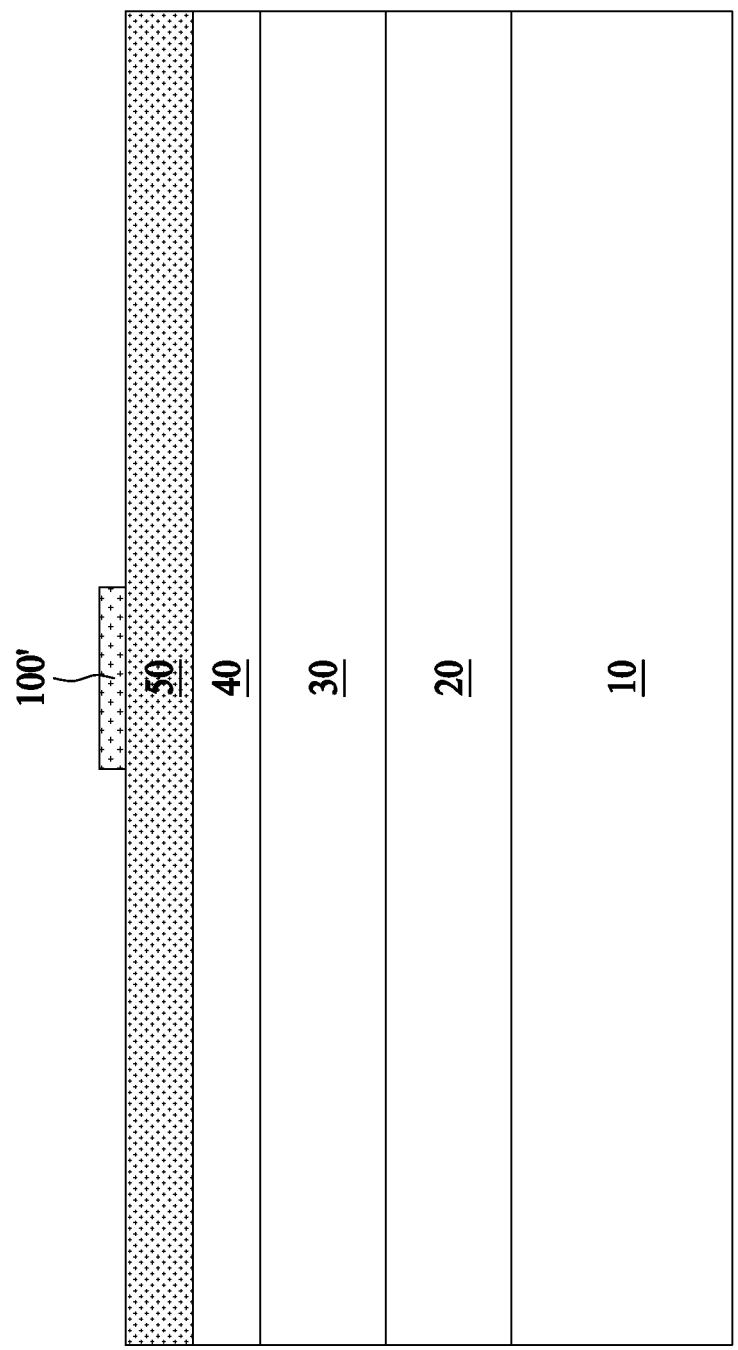
FIG. 8A, FIG. 8B, FIG. 8C and FIG. 8D illustrate various stages of a method for manufacturing a semiconductor device structure in accordance with some embodiments of the present disclosure.

The processes before FIG. 8A may be the same as or similar to the processes from FIG. 7A to FIG. 7B, and are not repeated herein.

Referring to FIG. 8A, a patterned mask layer 100' is formed on the barrier layer 40. The patterned mask layer 100' may be patterned to expose a portion of the doped group III-V layer 50. The patterned mask layer 100' may include elements of titanium, nickel, platinum, cobalt, other elements or a combination thereof. The portion in the relatively central region of the patterned mask layer 100' remains, and the portion in the relatively peripheral region of the patterned mask layer 100' is removed.

Figure 8B:
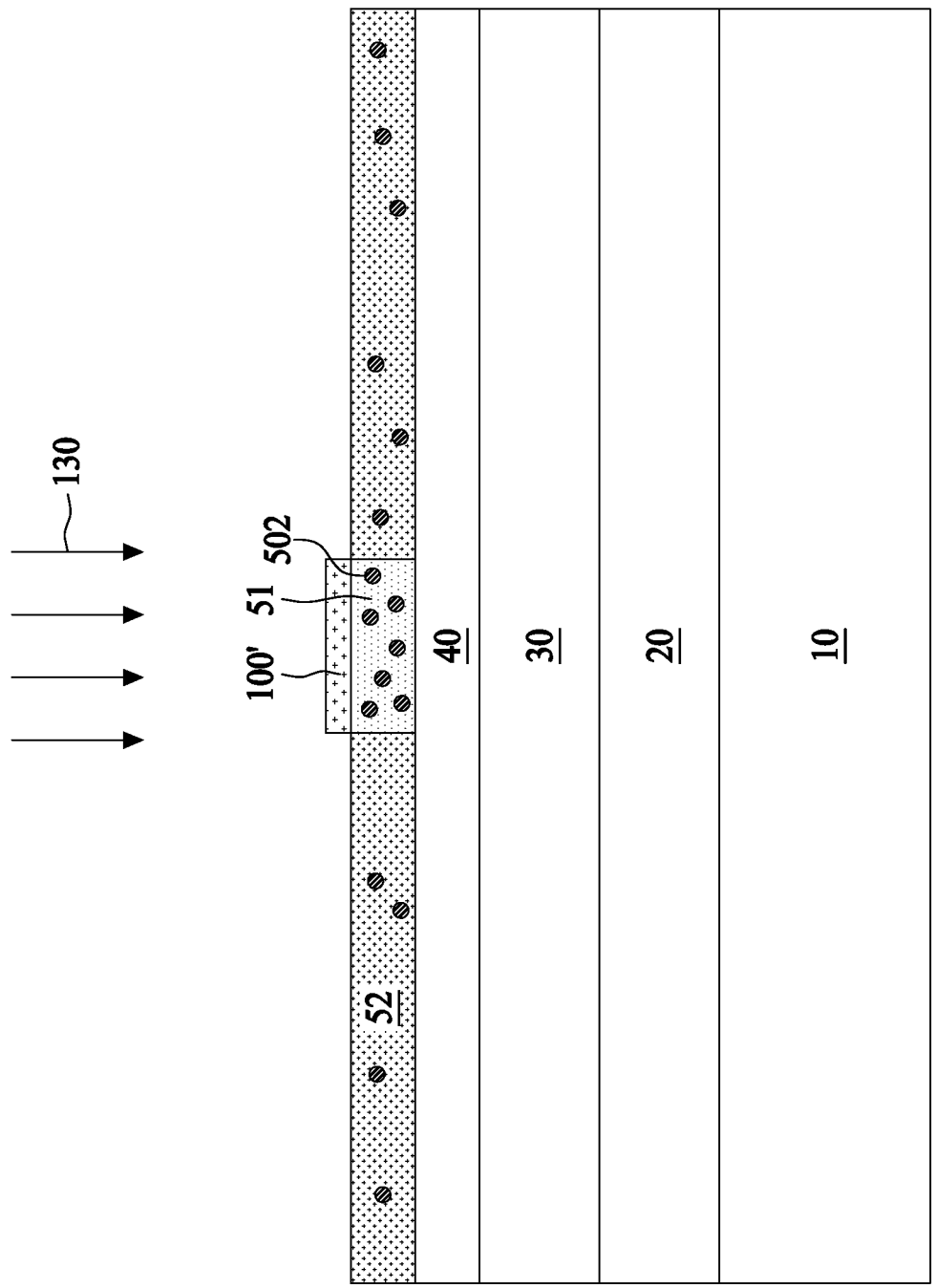

Referring to FIG. 8B, heat process 130 may be performed to treat the doped group III-V layer 50 such that the elements of the patterned mask layer 100' diffuse into the doped group III-V layer 50. A portion of the doped group III-V layer 50, covered by the patterned mask layer 100', may form the portion 51. The other portion of the doped group III-V layer 50 forms the portion 52. The heat treatment 130 may be performed at a temperature ranges from about 400° C. to about 600° C.

In this embodiments, nickel, titanium, cobalt, platinum or a combination thereof may diffuse into the portion of the doped group III-V layer 50 under the patterned mask layer 100'. Therefore, the concentration of additional dopant(s) 502, such as nickel, titanium, cobalt, platinum or a combination thereof, in the portion 51 may be greater than that of the portion 52. The portion 51 can provide sufficient holes to deplete electrons in 2DEG region under the portion 51. Nickel, titanium, cobalt, platinum or a combination thereof may further penetrate into the barrier layer 40.

In this embodiment, the portion 51 may have a greater concentration of titanium, nickel, platinum, cobalt or a combination thereof than the portion 52 has. Nickel, titanium, platinum, cobalt may assist in breaking more Mg—H bonding in the doped group III-V layer 50 such that the doped group III-V layer 50 may be activated in a lower temperature.

Figure 8C:
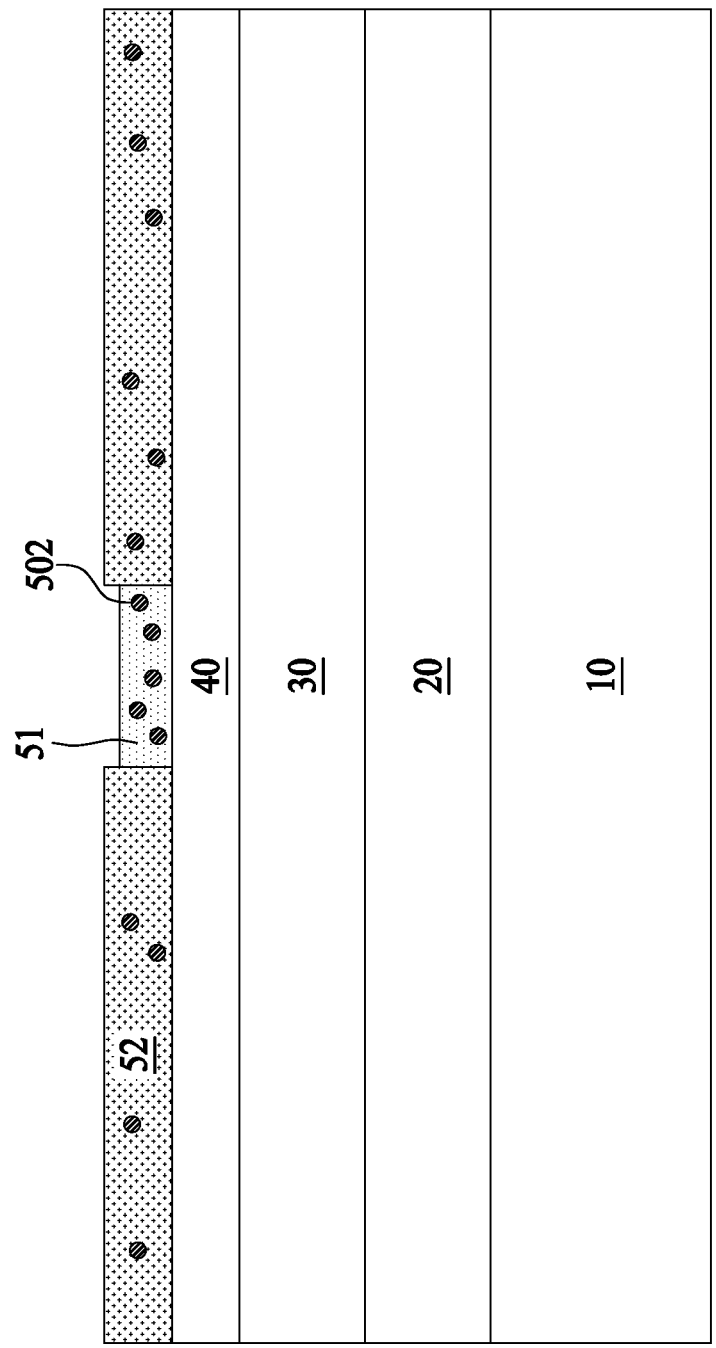

Referring to FIG. 8C, an etching process is performed to remove the patterned mask layer 100'. Etching process 140 may include, but is not limited to, dry etching, such as anisotropic etching. The portion 51 may be over etched so that the portion 51 may have a thickness smaller than that of the portion 52. In some embodiments, the portion 51 may substantially not be etched.

Figure 8D:
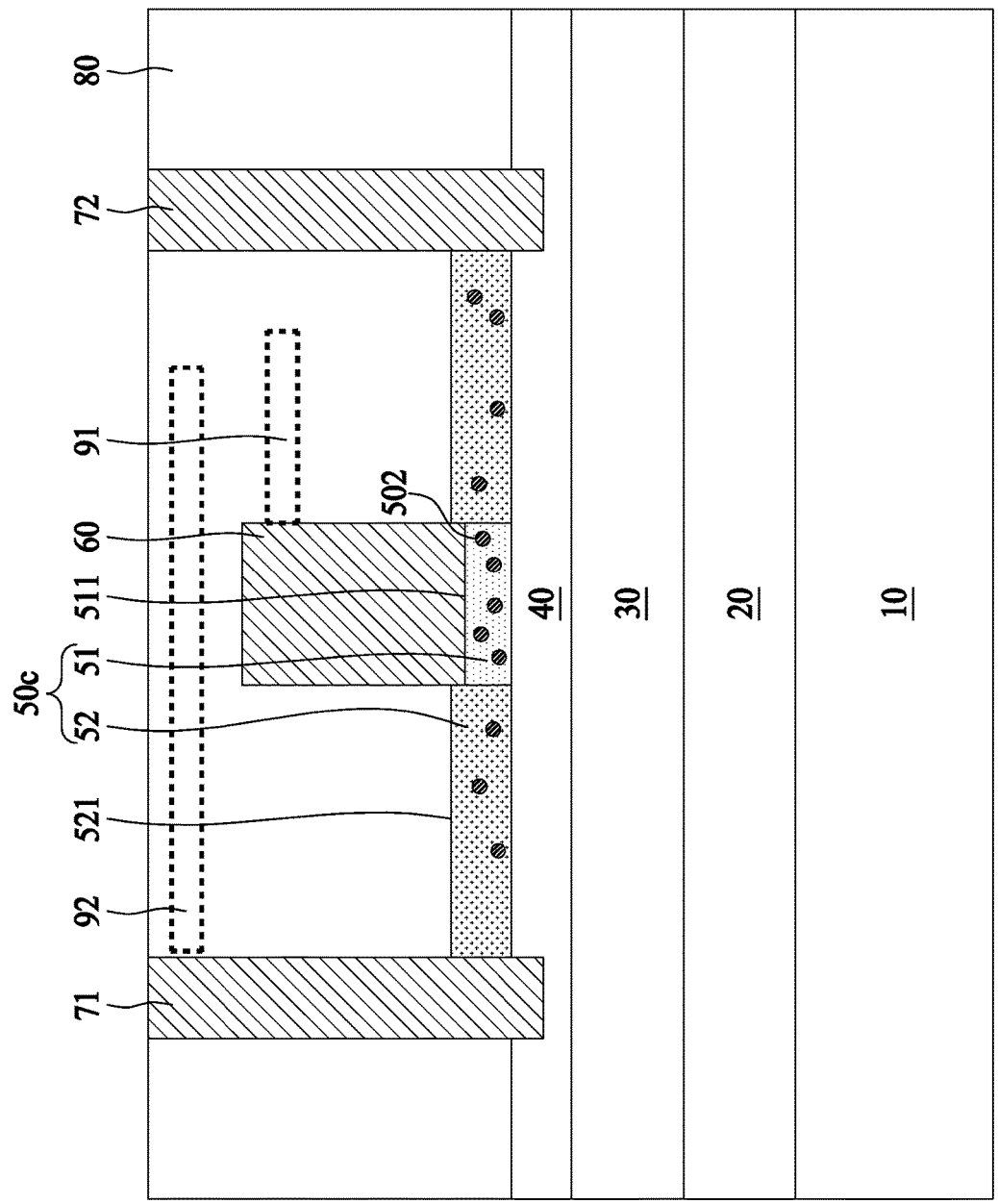

Referring to FIG. 8D, a gate structure 60, a source 71, a drain 72 and a passivation layer 80 are formed, thereby producing the semiconductor device structure 1c as shown in FIG. 4. An etching process may be performed to remove a portion of the portion 52 beyond the source 71 and/or the drain 72.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
   a substrate;
   a channel layer disposed on the substrate;
   a barrier layer disposed on the channel layer;
   a doped group III-V layer disposed on the barrier layer, comprising:
      a first portion having a first concentration of a first dopant for facilitating activation of the first portion; and
      a second portion adjacent to the first portion having a second concentration of the first dopant; and
   a gate structure disposed on the first portion of the doped group III-V layer,
      wherein the first concentration of the first dopant is different from the second concentration of the first dopant,
      wherein the first portion and the second portion further have a second dopant which is different from the first dopant, and
      the firs portion is disposed between the gate structure and the barrier layer and the second portion is disposed on the barrier layer.

2. The semiconductor device structure of claim 1, wherein a first surface of the first portion is substantially coplanar with a first surface of the second portion.

3. The semiconductor device structure of claim 1, wherein a first surface of the first portion has an elevation same to a first surface of the second portion.

4. The semiconductor device structure of claim 1, wherein a first surface of the first portion has an elevation greater than a first surface of the second portion.

5. The semiconductor device structure of claim 1, wherein a first surface of the first portion has an elevation less than a first surface of the second portion.

6. The semiconductor device structure of claim 4, wherein the first portion comprises a second surface opposite to the first surface, and the first surface of the second portion has an elevation between the first surface and the second surface of the first portion.

7. The semiconductor device structure of claim 4, wherein the first portion comprises a second surface opposite to the first surface, the second surface of the first portion has an elevation less than a second surface of the second portion, and the second surface of the second portion is opposite to the first surface of the second portion.

8. The semiconductor device structure of claim 1, wherein the first dopant comprises oxygen, nitrogen, silicon, titanium, gold, nickel, platinum, cobalt or a combination thereof.

9. The semiconductor device structure of claim 1, wherein the second dopant comprises magnesium, beryllium, zinc, cadmium or a combination thereof.

10. The semiconductor device structure of claim 1, further comprises:
    a source and a drain disposed on two opposite sides of the gate structure.

11. The semiconductor device structure of claim 10, wherein the second portion of the doped group III-V layer is spaced from at least one of the source and the drain.

12. The semiconductor device structure of claim 10, wherein the second portion of the doped group III-V layer is in direct contact with the source and the drain.

13. The semiconductor device structure of claim 10, wherein the second portion of the doped group III-V layer is disposed between the source and the first portion of the doped group III-V layer.

14. The semiconductor device structure of claim 1, wherein the first portion has a thickness greater than a thickness of the second portion.

15. The semiconductor device structure of claim 1, wherein the first portion has a sheet resistance less than the second portion.

16. The semiconductor device structure of claim 1, wherein the gate structure covers the first portion of the doped group III-V layer.

17. The semiconductor device structure of claim 1, wherein the second portion surround the first portion.

18. A semiconductor device structure, comprising:
   a substrate;
   a channel layer disposed on the substrate;
   a barrier layer disposed on the channel layer;
   a gate structure disposed on the barrier layer;
   a first semiconductor layer disposed between the gate structure and the barrier layer and having a first dopant for facilitating activation of the first semiconductor layer; and
   a second semiconductor layer disposed on the barrier layer and having the first dopant;
   wherein a concentration of the first dopant in the first semiconductor layer is greater than a concentration of the first dopant in the second semiconductor layer, and
   wherein the first semiconductor layer and the second semiconductor layer further have a second dopant which is different from the first dopant.

19. The semiconductor device structure of claim 18, wherein an upper surface of the first semiconductor layer being elevationally different from an upper surface of the second semiconductor layer.

20. The semiconductor device structure of claim 18, wherein the first dopant comprises oxygen, nitrogen, silicon, titanium, gold, nickel, platinum, cobalt or a combination thereof.

21. The semiconductor device structure of claim 18, wherein the second dopant comprises magnesium, beryllium, zinc, cadmium or a combination thereof.

22. The semiconductor device structure of claim 18, wherein the first semiconductor layer comprises p-GaN, and the second semiconductor layer comprises p-GaN.

23. The semiconductor device structure of claim 18, wherein a roughness of the upper surface of the first semiconductor layer is different from that of the second semiconductor layer.

24. A method for manufacturing a semiconductor device structure, comprising:
   providing a substrate;
   forming a channel layer on the substrate;
   forming a barrier layer on the channel layer;
   forming a doped group III-V layer on the barrier layer, the doped group III-V layer having a first dopant for facilitating activation of a portion of the doped group III-V layer; and
   treating the portion of the doped group III-V layer, such that a first concentration of the first dopant in the portion being different from a second concentration of the first dopant in a remaining portion of the doped group III-V layer,
   wherein the doped group III-V layer further has a second dopant which is different from the first dopant.

25. The method of claim 24, further comprising:
   forming a patterned mask layer on the doped group III-V layer; and
   patterning the patterned mask layer to expose the portion of the doped group III-V layer.

26. The method of claim 24, wherein a material of the patterned mask layer comprises titanium, nitrogen, silicon, gold or a combination thereof.

27. The method of claim 24, further comprising:
   forming a patterned mask layer on the doped group III-V layer; and
   patterning the patterned mask layer to remain a portion of the patterned mask layer covering the portion of the doped group III-V layer.

28. The method of claim 26, wherein a material of the patterned mask layer comprises titanium, nickel, platinum, cobalt or a combination thereof.

* * * * *